United States Patent
Wang

(10) Patent No.: US 6,180,980 B1
(45) Date of Patent: Jan. 30, 2001

(54) TRENCH NON-VOLATILE MEMORY CELL

(75) Inventor: Ting-Sing Wang, Hsichu Hsien (TW)

(73) Assignee: Mosel Vitelic Inc. (TW)

(*) Notice: Under 35 U.S.C. 154(b), the term of this patent shall be extended for 0 days.

(21) Appl. No.: 09/376,464

(22) Filed: Aug. 18, 1999

(30) Foreign Application Priority Data

Jul. 12, 1999 (TW) .................................. 88111768

(51) Int. Cl.$^7$ .................................................. H01L 21/78
(52) U.S. Cl. ............................................. 257/331; 257/322
(58) Field of Search .................................. 257/317, 322, 257/331, FOR 317, FOR 322, FOR 331

(56) References Cited

U.S. PATENT DOCUMENTS

| | | |
|---|---|---|
| 4,641,164 * | 2/1987 | Dolny et al. . |
| 5,122,848 * | 6/1992 | Lee et al. . |
| 5,929,482 * | 7/1999 | Kawakami et al. . |
| 5,962,893 * | 10/1999 | Omura et al. . |
| 6,091,107 * | 7/2000 | Amaratunga et al. . |

* cited by examiner

Primary Examiner—George Fourson
Assistant Examiner—Joannie A. Garcia
(74) Attorney, Agent, or Firm—Morrison & Foerster LLP

(57) ABSTRACT

A method of manufacturing a trench non-volatile memory cell, comprises the steps of: providing a semiconductor substrate; performing ion implantation to form a source region in the semiconductor substrate; forming a trench on the semiconductor substrate by silicon etching, the trench reaching down to the source region; growing a first isolation layer on the surface of the semiconductor substrate, and the bottom and sidewall of the trench; forming a hollow-shaped first conducting layer in the trench; performing thermal oxidation on the first conducting layer to form a bird's beak isolation layer and a floating gate, which are the oxidized and unoxidized part of the first conducting layer, respectively, wherein the floating gate has a peak; partially removing the first isolation layer and the bird's beak isolation layer to bare the surface of the semiconductor substrate, the peak and the sidewall of the trench; depositing a second conducting layer; patterning the second conducting layer to form a control gate; and defining a drain region in the semiconductor substrate.

4 Claims, 6 Drawing Sheets

TRENCH NON-VOLATILE MEMORY CELL

FIELD OF THE INVENTION

The invention is related to a method of manufacturing a memory cell, and particularly to a method of manufacturing a non-volatile memory cell, such as EEPROM.

BACKGROUND

Non-volatile memory cells, including stacked gate and split gate, are well-known in the art. The split gate structure has better over erase control performance, simple circuit design and faster access speed.

A cross section of a conventional Flash EEPROM is shown in FIG. 1. Drain impurity diffusion layer 16 and a source impurity diffusion layer 17 are formed on a main surface of the semiconductor substrate 10 and are spaced from each other by a predetermined distance with a channel region therebetween. The conventional Flash EEPROM further includes a floating gate electrode 13 formed on the channel region with a first gate oxide film 12 therebetween, a control gate electrode 15 formed on the floating gate electrode 13 with an insulating film 14 therebetween, an interlayer thermal oxide film 18 covering the semiconductor substrate 10, floating gate electrode 13 and control gate electrode 15, and an interlayer insulating film 19 covering the interlayer thermal oxide film 18. Gate bird's beak oxide films 20 are formed at opposite ends of the first gate oxide film 12 and opposite ends of the insulating film 14. The interlayer insulating film 19 contains an impurity such as boron or phosphorous. The purpose of the interlayer thermal oxide film 18 is to prevent the movement of the impurity (i.e., boron of phosphorous) of the interlayer insulating film 19 into the semiconductor substrate 10, control gate electrode 15 or floating gate electrode 13, and thus to prevent change of the electrical characteristics thereof.

After the final step of forming the interlayer insulating film 19 to cover the interlayer thermal oxide film 18 shown in FIG. 1, heat treatment by a reflow method is usually carried out to flatten the interlayer insulating film 19. During this process as well as while thermally growing the thermal oxide layer 18 by means of wet oxidation, oxidizer ($H_2O$) penetrates the interlayer insulating film 19 and interlayer thermal oxide film 18. This causes further oxidization between the semiconductor substrate 10 and the ends of the floating gate electrode 13, and between the control gate electrode 15 and the floating gate electrode 13. As a result, the gate bird's beak oxide films 20 are formed. Consequently, the lower end of the floating gate electrode 13 contacts the gate bird's beak oxide films 20 so that the lower end of the floating gate electrode 13 is oxidized to a large extent as compared with the other portions.

The gate bird's beak oxide film 20 can form either at the lower end of the floating gate 13 and the source impurity diffusion layer 17, or at the lower end of the floating gate near the drain impurity diffusion layer 16, or at both locations. In these cases, the conventional "beak" of the bird's beak is usually long and elongated, thus increasing the size of the cell and at the same time providing paths for current leakage and resulting, therefore, in low memory speed.

The formation of a conventional bird's beak in a polysilicon gate is better shown in FIGS. 1b and 1c. In FIG. 1b, layers of gate oxide 110, polysilicon 120 and nitride 130 are successively formed on substrate 100 and then patterned with a photomask layer 140 to define the floating polygate region 160. Subsequently, polysilicon layer 120 is oxidized, whereby gate bird's beaks 121 and 121' are formed as well known in the art. The prior art offers a method of implanting the polysilicon so as to decrease the growth of the protrusion of the gate bird's beak as shown by reference numerals 121 and 121' in FIG. 1c to a smaller size and sharper shape shown by reference numerals 125 and 125'. It will be known by those skilled in the art that the smaller the birds' beak, the smaller the encroachment under the polysilicon edge, and hence the smaller the impact on the electric-field intensity between the corner edge of the floating gate 129 and the control gate 180 of the completed cell structure shown in FIG. 1d, and thus the faster the memory speed. (See S. Wolf and R. N. Tauber, "Silicon Processing for the VLSI Era," vol. 2, Lattice Press, Sunset Beach, Calif., 1990, p. 438). It will also be appreciated that the smaller the bird's beak, the smaller the overall size of the memory cell, also contributing to the increased speed of the memory.

However, in the above-mentioned prior art, it is difficult to reduce the chip area occupied by the memory cells because all of the cells are built on the silicon surface.

SUMMARY OF THE INVENTION

Accordingly, it is one object of the invention to provide a method of manufacturing a trench non-volatile memory cell, comprising the steps of:
providing a semiconductor substrate; performing ion implantation to form a source region in the semiconductor substrate; forming a trench on the semiconductor substrate by silicon etching, said trench reaching down to the source region; growing a first isolation layer on the surface of the semiconductor substrate, and the bottom and sidewall of the trench; forming a hollow-shaped first conducting layer in the trench; performing thermal oxidation on the first conducting layer to form a bird's beak isolation layer and a floating gate, which are the oxidized and unoxidized part of the first conducting layer, respectively, wherein the floating gate has a peak; partially removing the first isolation layer and the bird's beak isolation layer to bare the surface of the semiconductor substrate, the peak and the sidewall of the trench; depositing a second conducting layer; patterning the second conducting layer to form a control gate; and defining a drain region in the semiconductor substrate.

It is another object of the invention to provide a trench non-volatile memory cell, comprising: a substrate; a source region defined in the substrate; a trench formed on the substrate and reaching down to the source region; a floating gate formed in the trench and having a peak; an isolation layer formed on the bottom and the sidewall of the trench, the surface of the substrate, and the peak; a bird's beak isolation layer formed on the non-peak part of the floating gate; a control gate formed on the isolation layer and the bird's beak isolation layer; and a drain region defined in the substrate and adjacent to the sidewall of the trench.

Since the trench non-volatile memory cell of the invention is built in the trench on the substrate, it is possible to reduce the chip area occupied by the memory cell. Thus, it is easier to scale down the memory circuit.

DESCRIPTION OF THE PREFERRED EMBODIMENTS

Figure 1A:
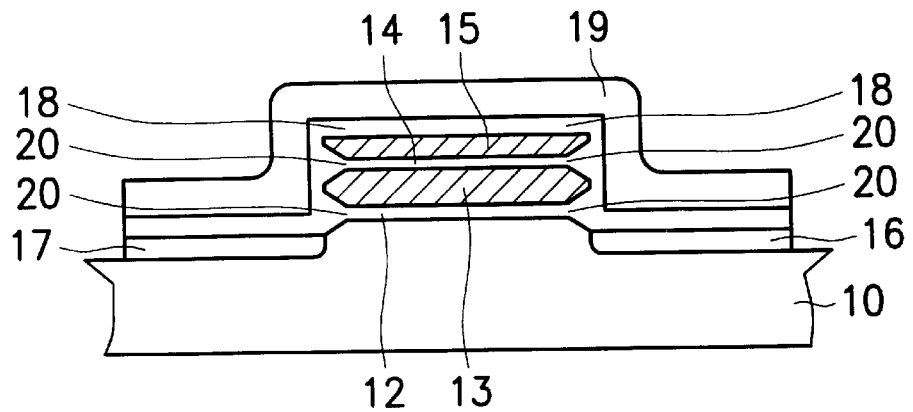
FIG. 1a is a partial cross-sectional view of a Flash EEPROM of the prior art.
Figure 1B:
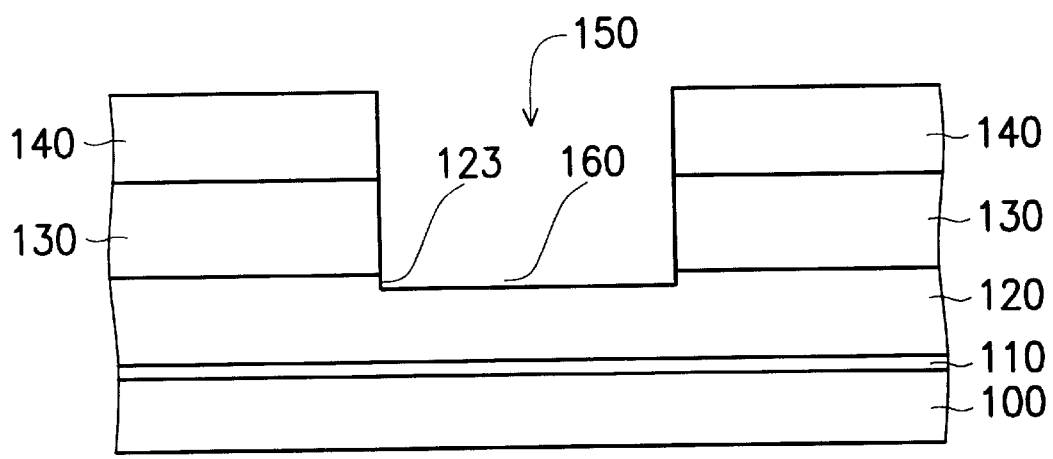
FIG. 1b–1c are partial cross-sectional views of a semiconductor substrate show in the forming of a gate bird's beak of the prior art.
Figure 1C:
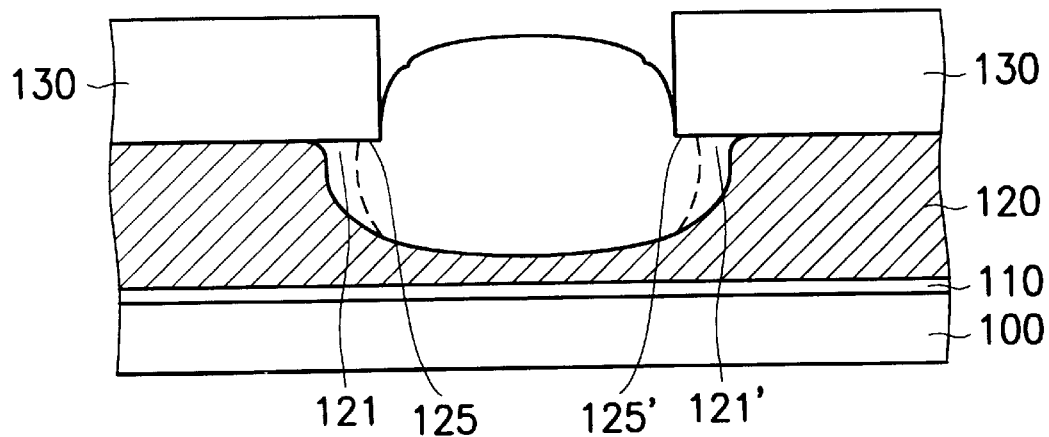
Figure 1D:
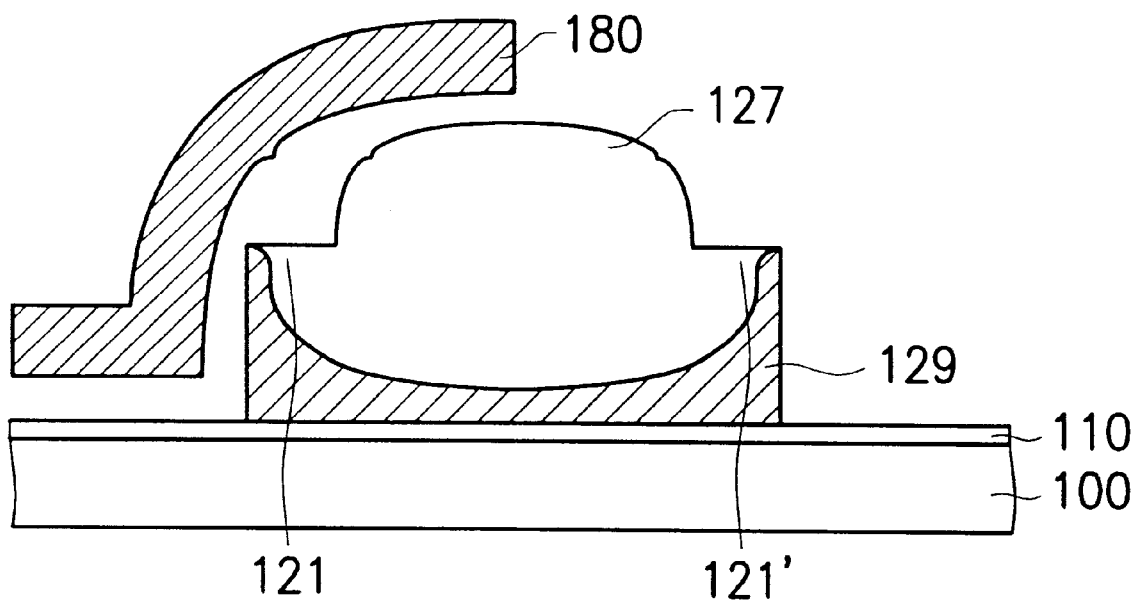
FIG. 1d is a partial cross-sectional view of a semiconductor substrate showing the forming of a completed memory cell having a gate bird's beak of the prior art.
Figure 2A:
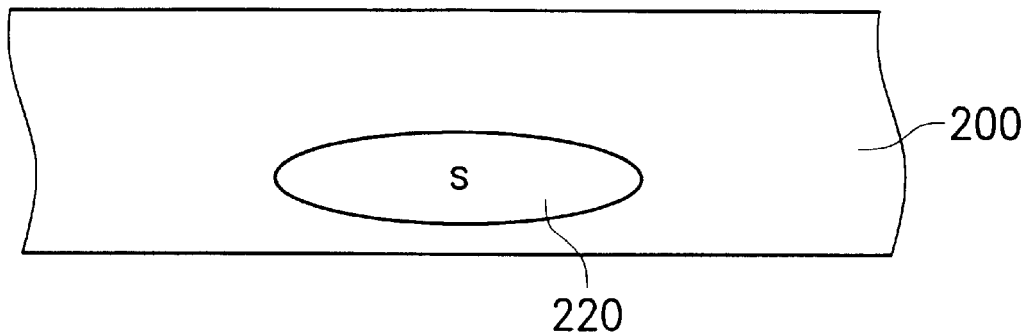
FIG. 2a–2i are partial cross-sectional views of a semiconductor substrate showing the forming of a trench non-volatile memory cell according to the invention.

In FIG. 2a, a substrate 200 composed of semiconductor material, such as silicon substrate with a P-well, is provided. An active area is defined on the substrate 200. Then, a source region 220 is formed in the substrate 200 by a high dose implantation.

Figure 2B:
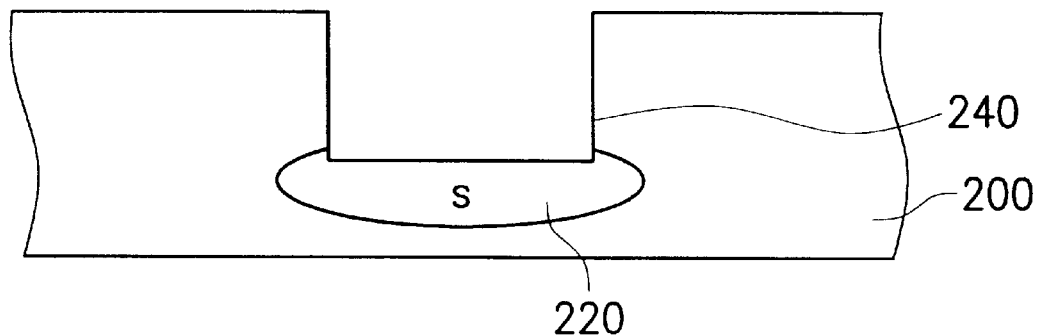

In FIG. 2b, a trench 240 is formed by silicon etching with an appropriate pattern and photomask. The trench 240 reaches down to the source region 220.

Figure 2C:
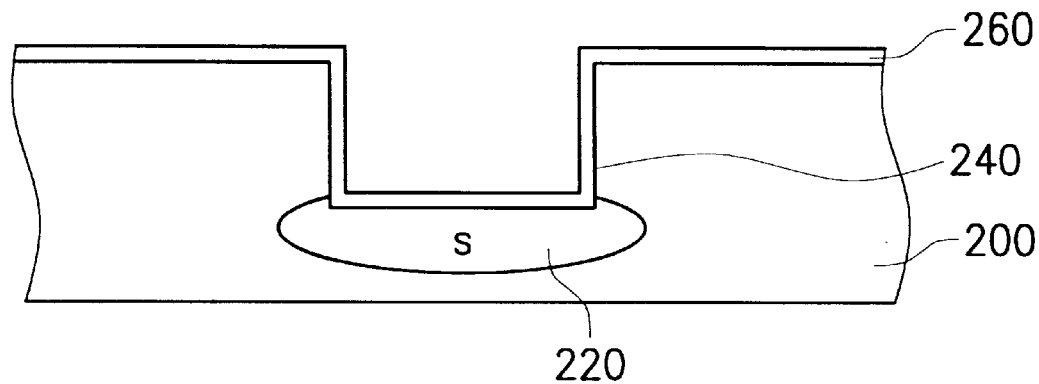

In FIG. 2c, a first isolation layer 260 is formed on the surface of the substrate 200, and the sidewall and the bottom of the trench 240. The first isolation layer is a gate oxide layer, which is formed by thermal oxidation at a temperature of 900° C., and is typically 100 Å thick.

Figure 2D:
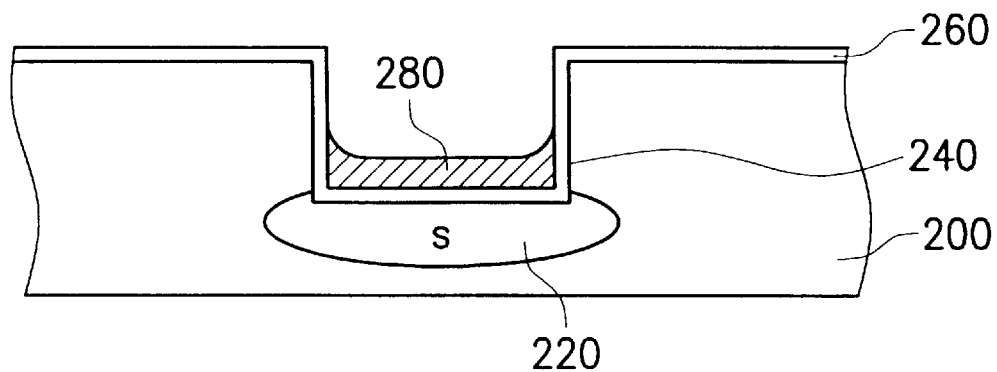

In FIG. 2d, a first conducting layer 280 is deposited. The first conducting layer 280 is used to form a floating gate of the memory cell and can be composed of polysilicon or amorphous silicon. In case of polysilicon, the formation of the first conducting layer 280 is completed by LPCVD method using methane as the main reactor, followed by partially etching it back. Thus, a hollow-shape first conducting layer 280 is formed.

Figure 2E:
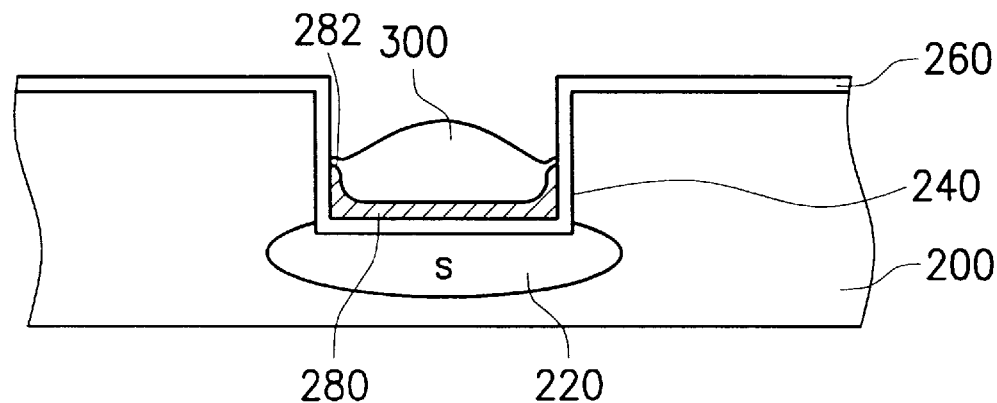

In FIG. 2e, a bird's beak isolation layer 300 is grown on the first conducting layer 280 by thermal oxidation at a temperature of 900° C. Particularly, the unoxidized part of the first conducting layer 280 is then formed as the floating gate and exhibits a protrusion 282 on the sides.

Figure 2F:
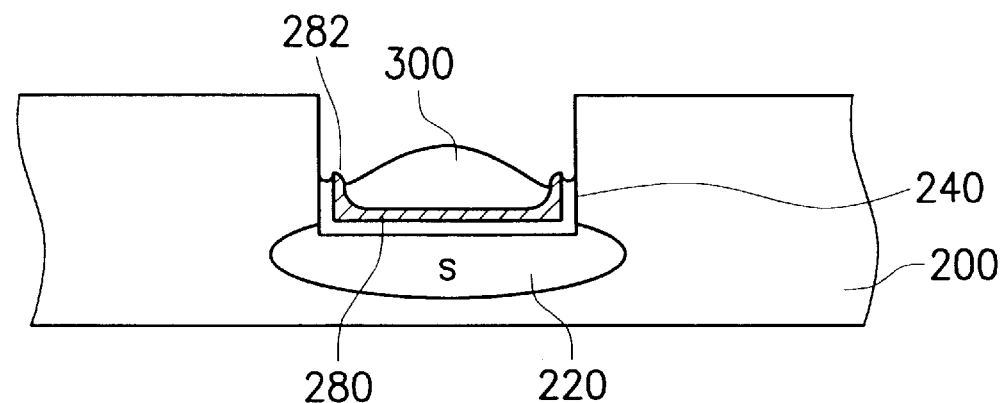

In FIG. 2f, the first isolation layer and the bird's beak isolation layer are partially removed so that the surface of the substrate 200, the protrusion 282 of the floating gate and the sidewall of the trench 240 are bared. This can be accomplished by the steps of pre-cleaning and etching.

Figure 2G:
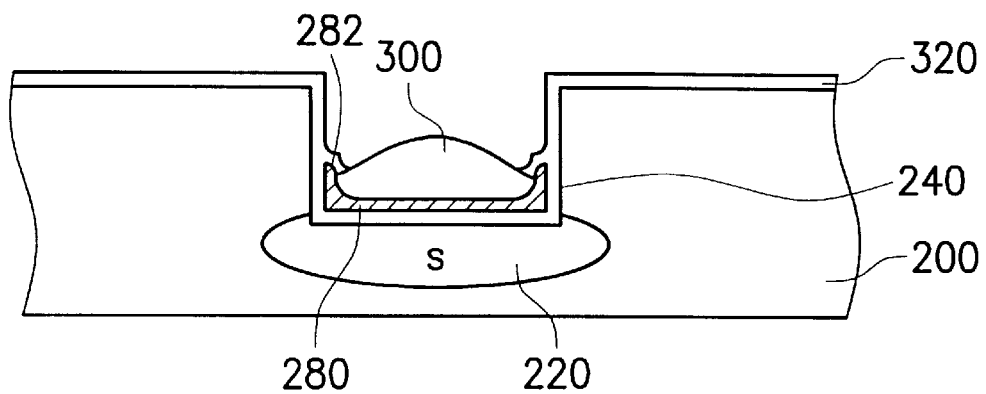

In FIG. 2g, a second isolation layer 320 is grown on the bared surface of the substrate 200, the protrusion 282 of the floating gate and the sidewall of the trench 240. The second isolation layer 320 can be composed of $SiO_2$, which is grown by high temperature oxidation or LPCVD method. The second isolation layer 320 is used as gate oxide and tunneling oxide and is typically 100 Å thick.

Figure 2H:
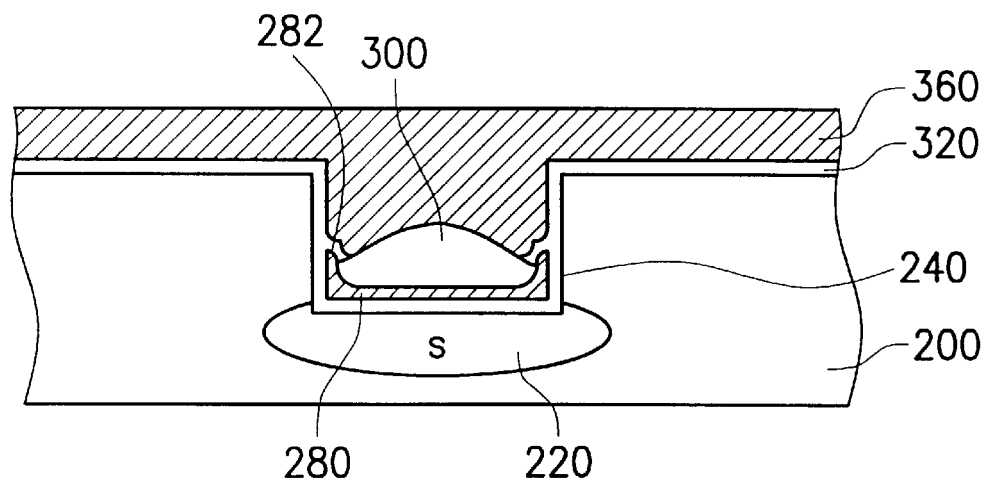

In FIG. 2h, a second conducting layer 360 is deposited. The second conducting layer 360 is used to form a control gate of the memory cell and can be composed of polysilicon or amorphous silicon. In case of polysilicon, the formation of the second conducting layer 360 is completed by LPCVD method using methane as the main reactor.

Figure 2I:
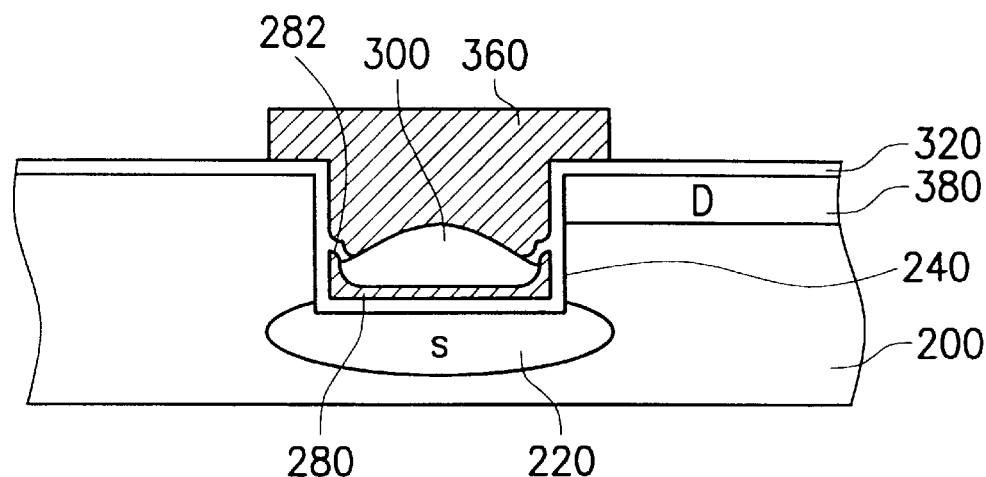

In FIG. 2i, the second conducting layer 360 is patterned. The patterned second conducting layer 360, the bird's beak isolation layer 300, the first conducting layer 280 and the second isolation layer 320 compose a split gate structure. Additionally, a drain region 380 is formed in the substrate 200 beside the trench 240 by ion implantation.

Figure 3:
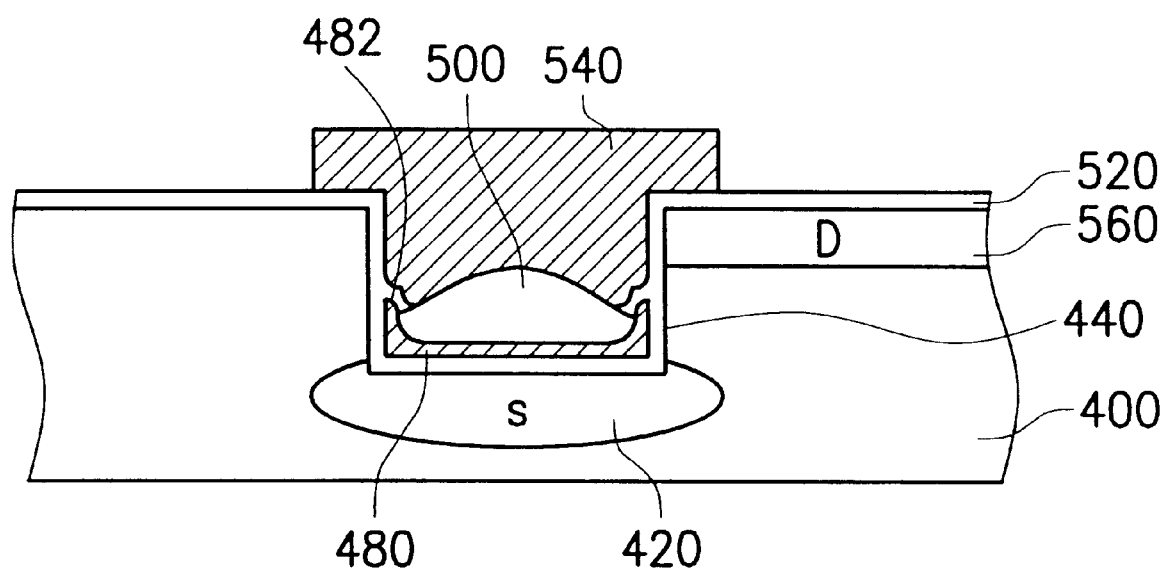
FIG. 3 is a partial cross-sectional view of a semiconductor substrate showing the trench non-volatile memory cell according to the invention.

FIG.3 shows a trench non-volatile memory cell manufactured by the above-described method of this invention. The trench non-volatile memory cell comprises a substrate 400; a source region 420; a trench 440; an oxide layer 520 grown on the surface of the substrate 400, on the sidewall and the bottom of the trench 440 and on the protrusion 482; a floating gate 480 with the protrusion 482; a bird's beak isolation layer 500 grown on the floating gate 480; a control gate 540; and a drain region 560.

The operation of the trench non-volatile memory cell of the invention will be explained.

1. Program Mode: A first high, second high and a ground voltage level are applied to the source region 420, the control gate 540 and the drain region 560, respectively. The second high voltage level is lower than the first one and is higher than a threshold voltage. Thus, hot electrons can be absorbed into the floating gate 480.
2. Erase Mode: A high voltage level is applied to the control gate 540 while a ground voltage level is applied to the source 420 and the drain region 560. The hot electrons are drawn into the control gate 540 through the protrusion 482 by a high electric field across the floating gate 480.
3. Read Mode: A voltage level is applied to the control gate 540 for activating a current from the drain region 560 to the source region 420.

Since the non-volatile memory cell of the invention uses a trench structure, the depth of the trench can be substituted for the desired width of the conventional split gate built on the substrate. This results in a smaller chip area occupied by each memory cell. Thus, the circuit is scaled down.

The embodiments described above are illustrative of the principles of the present invention and are not intended to limit the invention to the particular embodiment described. Those skilled in the art may make various changes in the embodiments without departing from the spirit and scope of the invention. Various embodiments are within the scope of the following claims.

What is claimed is:

1. A trench non-volatile memory cell, comprising:

a substrate;

a source region defined in the substrate;

a trench formed on the substrate and reaching down to the source region;

a floating gate formed in the trench and having a peak;

an isolation layer formed on the bottom and the sidewall of the trench, the surface of the substrate, and the peak;

a bird's beak isolation layer formed on the non-peak part of the floating gate;

a control gate formed on the isolation layer and the bird's beak isolation layer; and a drain region defined in the substrate and adjacent to the sidewall of the trench.

2. The trench non-volatile memory cell in claim 1, wherein said floating gate is a polysilicon layer.

3. The trench non-volatile memory cell in claim 1, wherein said floating gate is an amorphous silicon layer.

4. The trench non-volatile memory cell in claim 1, wherein the isolation layer is composed of a gate oxide layer and a tunneling oxide layer.

* * * * *